United States Patent
Shi et al.

(10) Patent No.: US 11,289,671 B2
(45) Date of Patent: Mar. 29, 2022

(54) COVER PLATE FOR FLEXIBLE SUBSTRATE, AND FLEXIBLE DISPLAY DEVICE

(71) Applicant: BOE Technology Group Co., Ltd., Beijing (CN)

(72) Inventors: Yongxiang Shi, Beijing (CN); Paoming Tsai, Beijing (CN); Dejun Bu, Beijing (CN); Peng Cai, Beijing (CN); Jiahao Zhang, Beijing (CN); Shuang Du, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 281 days.

(21) Appl. No.: 16/565,944

(22) Filed: Sep. 10, 2019

(65) Prior Publication Data

US 2020/0266380 A1 Aug. 20, 2020

(30) Foreign Application Priority Data

Feb. 19, 2019 (CN) .......................... 201920212638.X

(51) Int. Cl.
*H01L 51/52* (2006.01)
*H01L 51/00* (2006.01)

(52) U.S. Cl.
CPC .......... *H01L 51/52* (2013.01); *H01L 51/0097* (2013.01); *H01L 2251/5338* (2013.01)

(58) Field of Classification Search
CPC combination set(s) only.
See application file for complete search history.

(56) References Cited

U.S. PATENT DOCUMENTS

| | | | |
|---|---|---|---|
| 2017/0179424 A1* | 6/2017 | Lee | H01L 51/0097 |
| 2019/0131571 A1* | 5/2019 | Thothadri | G02F 1/133305 |
| 2019/0346591 A1* | 11/2019 | Thothadri | H01L 51/5275 |
| 2020/0081162 A1* | 3/2020 | Park | H01L 51/5237 |

* cited by examiner

*Primary Examiner* — Kevin Quarterman
(74) *Attorney, Agent, or Firm* — Nath, Goldberg & Meyer; Joshua B. Goldberg

(57) ABSTRACT

The present disclosure provides a cover plate for a flexible substrate which includes a first hardened layer, a second hardened layer and a polymer thin film layer provided between the first hardened layer and the second hardened layer, wherein a hardness of the first hardened layer is less than that of the second hardened layer, a hardness of the polymer thin film layer is less than that of the first hardened layer, and a bending radius of the first hardened layer is greater than that of the second hardened layer.

19 Claims, 2 Drawing Sheets

COVER PLATE FOR FLEXIBLE SUBSTRATE, AND FLEXIBLE DISPLAY DEVICE

CROSS-REFERENCE TO RELATED APPLICATION

The present application claims priority to Chinese Patent Application No. 201920212638.X, filed to State Intellectual Property Office of the Republic of China on Feb. 19, 2019, titled "Cover Plate for Flexible Substrate, and Flexible Display Device", the disclosure of which is hereby incorporated by reference in its entirety.

TECHNICAL FIELD

The present disclosure relates to the field of display technology, in particular, to a cover plate for a flexible substrate, and a flexible display device.

BACKGROUND

Currently, the market share of flexible display products is increasing, and flexible display products rely on OLED display devices achieveing curling and folding properties. Folding products require a folding radius of 3 mm or even 1 mm. For such bending conditions, high bending resistance requirements for the light emitting devices themselves are required, but also high bending resistance requirements for assembly materials such as polarizers, optical clear adhesives (OCA), cover plates, and so on are required.

The inventors have found that at least the following problems exist in the prior art: the existing cover plate for a flexible display substantially adopts a structure of a combination of a flexible polymer thin film and a hardened layer, and the obvious disadvantages of such a structure is that the hardness is low, the impact resistance is poor, and it is not easy to return to a flat state after staying in a static bending state for a long time.

SUMMARY

The present disclosure provides a cover plate for a flexible substrate, and a flexible display device.

Technical solutions to solve the technical problems in the present disclosure are as follows:

A cover plate for a flexible substrate includes a first hardened layer, a second hardened layer and a polymer thin film layer provided between the first hardened layer and the second hardened layer, wherein a hardness of the first hardened layer is less than that of the second hardened layer, a hardness of the polymer thin film layer is less than that of the first hardened layer, and a bending radius of the first hardened layer is greater than that of the second hardened layer.

Optionally, a pencil hardness of the second hardened layer is greater than or equal to 9H; a pencil hardness of the first hardened layer ranges from 6H to 8H.

Optionally, a tensile modulus of the polymer thin film layer is greater than that of the first hardened layer, and is less than that of the second hardened layer.

Optionally, the tensile modulus of the polymer thin film layer ranges from 6 to 9 GPa, the tensile modulus of the second hardened layer ranges from 10 to 15 GPa, and the tensile modulus of the first hardened layer ranges from 9 to 12 GPa.

Optionally, the first hardened layer is composed of polysiloxane; the second hardened layer is composed of acrylic.

Optionally, the polymer thin film layer is any single film selected from a polyimide thin film, a polymethyl methacrylate thin film, and a polyethylene naphthalate thin film, or a composite film formed by stacking at least two films selected from a polyimide thin film, a polymethyl methacrylate thin film, and a polyethylene naphthalate thin film.

Optionally, a thickness of the second hardened layer ranges from 5 to 25 µm, a thickness of the first hardened layer ranges from 5 to 25 µm, and a thickness of the polymer thin film layer ranges from 40 to 100 µm.

Optionally, a side of the first or the second hardened layer distal to the polymer thin film layer is provided with an adhesive layer thereon.

Optionally, the cover plate has a bending region by which the cover plate is formed as a curved surface, and the second hardened layer in the bending region has a patterned pattern to form, in the second hardened layer, a plurality of spaces in which no second hardened layer is coated therein.

The present disclosure further provides a flexible display device including a flexible substrate and the above cover plate provided on a side of the flexible substrate.

Optionally, the flexible substrate is a curved flexible substrate, the cover plate is provided on a side of the flexible substrate having a smaller bending curvature, and the second hardened layer is disposed closer to the flexible substrate than the first hardened layer.

Optionally, the flexible substrate is a curved flexible substrate, the cover plate is provided on a side of the flexible substrate having a larger bending curvature, and the first hardened layer is disposed closer to the flexible substrate than the second hardened layer.

DETAILED DESCRIPTION

The present disclosure will be further described in detail below in conjunction with the accompanying drawings and specific implementations in order that those skilled in the art can understand the technical solutions of the present disclosure better.

Figure 1:
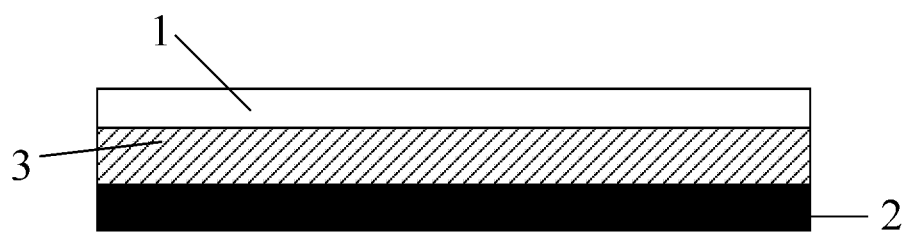
FIG. 1 is a structural diagram of a cover plate for a flexible substrate according to an embodiment of the present disclosure.
Figure 2:
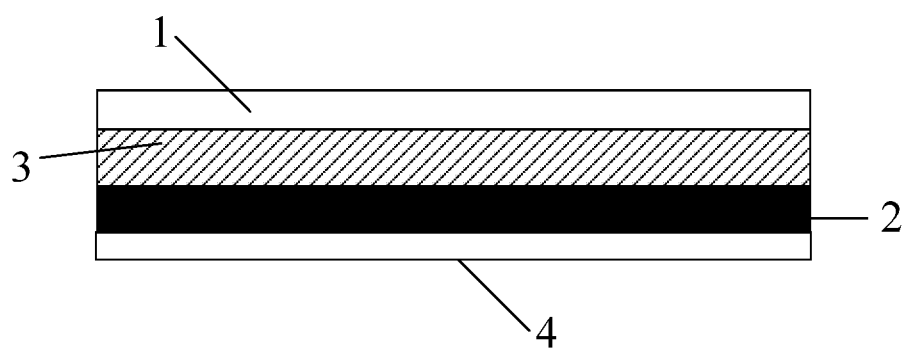
FIG. 2 is a structural diagram of a cover plate for a flexible substrate according to another embodiment of the present disclosure.

The present embodiment provides a cover plate for a flexible substrate which includes, as shown in FIG. 1, a first hardened layer 1 and a second hardened layer 2 composed of a hard coating respectively, and a polymer thin film layer 3 provided between the first hardened layer 1 and the second hardened layer 2, wherein a hardness of the first hardened layer 1 is less than that of the second hardened layer 2, a hardness of the polymer thin film layer 3 is less than that of the first hardened layer 1, and a bending radius of the first hardened layer 1 is greater than that of the second hardened layer 2.

The cover plate of the present embodiment includes two hard coatings and is used in a flexible substrate. Since the first hardened layer 1 has a relative low hardness, good flexibility and good bending resistance, ensuring that the first hardened layer cannot crack during the bending process of the flexible substrate, and the first hardened layer can realize an excurvation or outward bending with a small radius; since the second hardened layer 2 has a relative high hardness, so that the hardness of the cover plate is greatly improved, which is advantageous for recovery of the flexible substrate after being bent. It can also avoid the problem of warpage of a single-layer hard coating which occurs after the reliability text in high temperature and high humidity environment.

The present embodiment provides a cover plate for a flexible substrate which includes, as shown in FIGS. 2 to 7, a first hardened layer 1 and a second hardened layer 2, and a polymer thin film layer 3 provided between the first hardened layer 1 and the second hardened layer 2, wherein a hardness of the first hardened layer 1 is less than that of the second hardened layer 2, a hardness of the polymer thin film layer 3 is less than that of the first hardened layer 1, and a bending radius of the first hardened layer 1 is greater than that of the second hardened layer 2. Further, a side of the first or the second hardened layer 1 or 2 distal to the polymer thin film layer 3 is provided with an adhesive layer 4 thereon.

Figure 3:
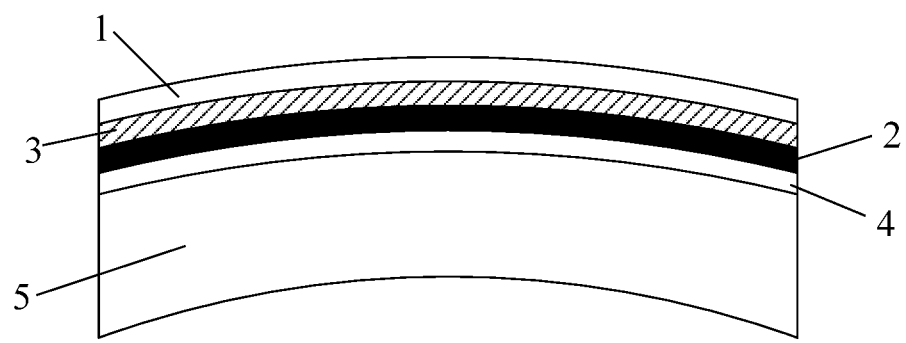
FIG. 3 is a structural diagram of a flexible display device according to still another embodiment of the present disclosure.
Figure 4:
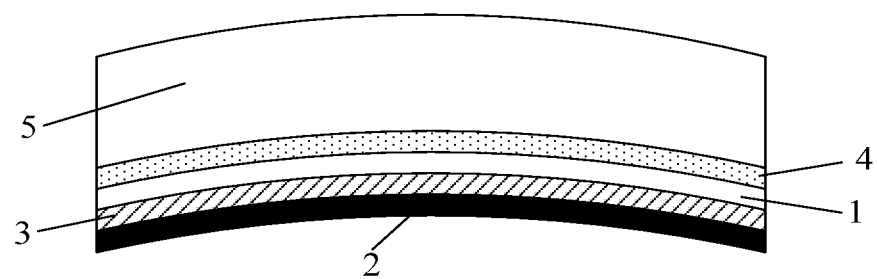
FIG. 4 is another structural diagram of a flexible display device according to still another embodiment of the present disclosure.

The cover plate in the present embodiment is provided with the adhesive layer 4 thereon, so that the first or the second hardened layer 1 or 2 is attached onto the flexible substrate 5 by the adhesive layer 4. Specifically, whether the adhesive layer 4 is disposed on the first hardened layer 1 or the second hardened layer 2 is determined according to a bending direction of the flexible substrate. As shown in FIGS. 3 and 4, a bending curvature of the second hardened layer 2 is larger than that of the first hardened layer 1. It should be noted that, the curvature herein indicates the degree to which the curve deviates from a straight line; the larger the curvature, the greater the degree of bending of the curve. The present embodiment will be described in detail below by taking the structure of FIG. 3 as an example.

Figure 5:
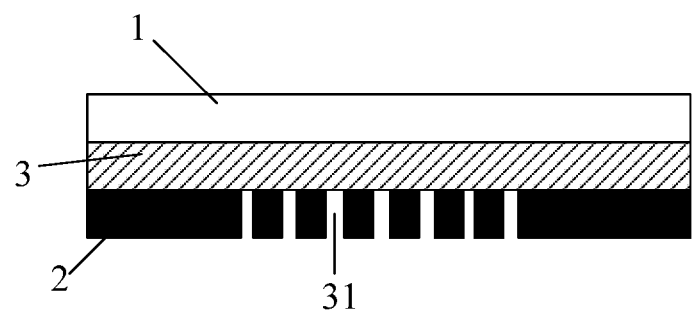
FIG. 5 is another structural diagram of a cover plate for a flexible substrate according to another embodiment of the present disclosure.

In an embodiment, as shown in FIG. 5, the cover plate has a bending region for forming the cover plate as a curved surface, and the second hardened layer 2 has patterned spaces in the bending region, that is, the second hardened layer 2 in the bending region has spaces 31 in which no hardened layer is coated; the width of these spaces is not limited here.

The cover plate in the present embodiment has patterned spaces 31 provided in the region for bending in the second hardened layer 2. These spacers 31 are provided in order to achieve a smaller bending radius, which further improves the bending performance of the second hardened layer 2.

The specific materials of the first hardened layer 1 and the second hardened layer 2 are not limited in this embodiment, as long as the hardness of the first hardened layer 1 is less than the hardness of the second hardened layer 2. In an embodiment, the first hardened layer 1 is composed of polysiloxane; and the second hardened layer 2 is composed of acrylic.

The first hardened layer 1 composed of a polysiloxane-based polymer has good flexibility and bending resistance. The second hardened layer 2 composed of an acrylic-based polymer has a high hardness. That is, when the structure of FIG. 3 is bent, the first hardened layer 1 is in a stretched state, and the second hardened layer 2 is in a compressed state; therefore, the outer first hardened layer 1 is made of a siloxane-based hard coating having good flexibility and tensile property, and the inner second hardened layer 2 is made of an acrylic-based hard coating having a high hardness. The design of the structure can improve the hardness of the cover plate under the premise of ensuring the bending performance of the cover plate.

The specific performance parameters of the first hardened layer 1 and the second hardened layer 2 are not limited in this embodiment, and may be selected according to the actual needs of the bending curvature of the flexible substrate, as long as the hardness of the first hardened layer 1 is less than that of the second hardened layer 2. In an embodiment, the pencil hardness (also referred to as determination of film hardness by pencil test) of the second hardened layer 2 is greater than or equal to 9H; the pencil hardness of the first hardened layer 1 ranges from 6H to 8H.

The specific material of the polymer thin film layer 3 is also not limited in this embodiment. In an embodiment, the polymer thin film layer 3 is any single film selected from a polyimide (PI) thin film, a polymethyl methacrylate (PMMA) thin film, and a polyethylene naphthalate (PEN) thin film, or a composite film formed by stacking at least two films selected from a polyimide (PI) thin film, a polymethyl methacrylate (PMMA) thin film, and a polyethylene naphthalate (PEN) thin film.

The materials of PI, PMMA, PEN and the like or a material formed by stacking those materials can meet the requirements of high hardness and bending resistance of the cover plate.

The specific thicknesses of the various functional layers are not limited in this embodiment, and may be modified according to specific dimensions of a flexible substrate. In an embodiment, the thickness of the second hardened layer 2 ranges from 5 to 25 μm, the thickness of the first hardened layer 1 ranges from 5 to 25 μm, and the thickness of the polymer thin film layer 3 ranges from 40 to 100 μm.

That is to say, each of the thicknesses of the second hardened layer 2 and the first hardened layer 1 is thinner than the thickness of the polymer thin film layer 3, i.e., the second hardened layer 2 and the first hardened layer 1 each has a thinner thickness are disposed at two sides of the polymer thin film layer 3 to sandwich the polymer thin film layer 3 therebetween, and the above effect can be achieved.

In an embodiment, a tensile modulus of the polymer thin film layer 3 is greater than that of the first hardened layer 1, and is less than that of the second hardened layer 2.

The specific moduli of various structural material are not limited in this embodiment, and can be selected according to an actual need of the bending curvature of a flexible substrate, as long as the moduli of the three layers are increased or decreased sequentially. In an embodiment, the tensile modulus of the polymer thin film layer 3 ranges from 6 to 9 GPa, the tensile modulus of the second hardened layer 2 ranges from 10 to 15 GPa, and the tensile modulus of the first hardened layer 1 ranges from 9 to 12 GPa.

In a specific embodiment, the pencil hardness of the second hardened layer 2 is 9H. When the cover plate is attached to a flexible substrate by the adhesive layer 4, the overall hardness of the cover plate is also up to 7H, because of the second hardened layer 2 has a high hardness. Even if the second hardened layer 2 is on a soft substrate, the hardness of the second hardened layer 2 will not decrease significantly. In addition, since the second hardened layer 2 is on the inner side during the bending process, it is subjected to compressive stress, and even if the second hardened layer 2 has a high hardness, the second hardened layer 2 will not crack or be damaged when being bending, therefore the inner second hardened layer 2 can be formed by an acrylic-based hard coating with a high hardness.

Figure 6:
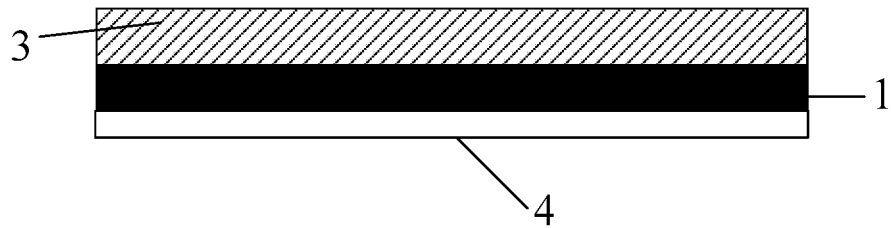
FIG. 6 is a structural diagram of a cover plate according to a comparative example of the present disclosure.

In a comparative example, as shown in FIG. 6, the cover plate includes a first hardened layer 1 and a polymer film layer 3, and a side of the first hardened layer 1 distal to the polymer film layer 3 is provided with an adhesive layer 4. The first hardened layer 1 has a pencil hardness of 9H, but when the first hardened layer 1 is attached to a flexible substrate, the first hardened layer 1 has a hardness in a range of only 2H to 3H. This is because the OCA of the adhesive layer 4 below is soft, which resulting in a serious decrease in hardness.

Figure 7:
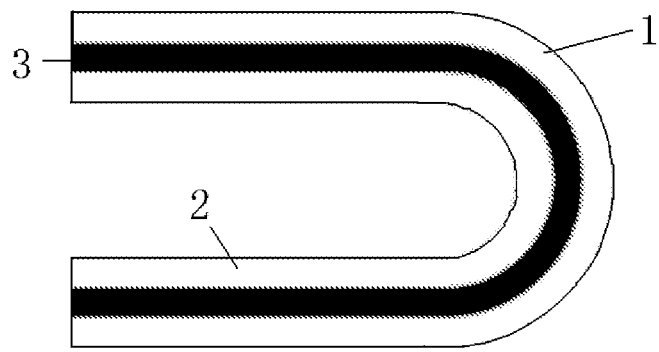
FIG. 7 is a structural diagram of a cover plate in a resilience test according to an embodiment of the present disclosure.

The cover plates of the embodiment and the comparative example are bent in a shape as shown in FIG. 7, and then the external force is removed to perform a resilience test. The angle for which the cover plate of the embodiment is unrecoverable is only about 70°, while the angle for which the cover plate of the comparative example is unrecoverable is about 110°. The cover plate of the embodiment has a greater improvement in the recovery capability than the cover plate of the comparative example. This is because, when the cover plate is outward bent (i.e., the first hardened layer 1 is outside, and the second hardened layer 2 is inside), the second hardened layer 2 is in a compressed state and is subjected to compressive stress. Since the second hardened layer 2 has a large modulus (10 GPa to 15 GPa), when the external force is released, there is a large resilience for restoring the cover plate to a flat state.

The present embodiment provides a flexible display device which includes, as shown in FIGS. 3 and 4, a flexible substrate 5 and the cover plate in the above embodiment provided on a side of the flexible substrate.

The cover plate in the flexible display device of this embodiment includes two hard coatings. Since the first hardened layer 1 has a relative low hardness, good flexibility and bending resistance, ensuring that the first hardened layer 1 will not crack during the bending process of the flexible substrate, and the first hardened layer 1 can realize an excurvation with a small radius; since the second hardened layer 2 has a relative high hardness, so that the hardness of the cover plate is greatly improved, which is advantageous for recovery of the flexible substrate after being bent. It can also avoid the problem of warpage of a single-layer hard coating which occurs after the reliability text in high temperature and high humidity environment.

Optionally, the flexible substrate is a curved flexible substrate. As shown in FIG. 3, the cover plate is provided on a side of the flexible substrate having a smaller bending curvature, and the second hardened layer 2 is disposed closer to the flexible substrate than the first hardened layer 1; or as shown in FIG. 4, the cover plate is provided on a side of the flexible substrate having a larger bending curvature, and the first hardened layer 1 is disposed closer to the flexible substrate than the second hardened layer 2.

Specifically, the display device may be any product or component having a display function such as an electronic paper, an OLED panel, a mobile phone, a tablet, a television, a display, a notebook computer, a digital photo frame, a navigator, and so on.

It will be appreciated that the above embodiments are merely exemplary implementations employed to explain the principles of the present disclosure, but the present disclosure is not limited thereto. Various modifications and improvements can be made by those skilled in the art without departing from the spirit and scope of the disclosure, and such modifications and improvements are also considered to be within the scope of the present disclosure.

What is claimed is:

1. A cover plate for a flexible substrate, comprising a first hardened layer, a second hardened layer and a polymer thin film layer provided between the first hardened layer and the second hardened layer, wherein a hardness of the first hardened layer is less than a hardness of the second hardened layer, a hardness of the polymer thin film layer is less than a hardness of the first hardened layer, a bending radius of the first hardened layer is greater than a bending radius of the second hardened layer, and the first hardened layer is composes of polysiloxane; the second hardened layer is composed of acrylic.

2. The cover plate of claim 1, wherein a pencil hardness of the second hardened layer is greater than or equal to 9H; a pencil hardness of the first hardened layer ranges from 6H to 8H.

3. The cover plate of claim 1, wherein a tensile modulus of the polymer thin film layer is greater than a tensile modulus of the first hardened layer, and is less than a tensile modulus of the second hardened layer; the tensile modulus of the polymer thin film layer ranges from 6 GPa to 9 GPa, the tensile modulus of the second hardened layer ranges from 10 GPa to 15 GPa, and the tensile modulus of the first hardened layer ranges from 9 GPa to 12 GPa.

4. The cover plate of claim 2, wherein a tensile modulus of the polymer thin film layer is greater than a tensile modulus of the first hardened layer, and is less than a tensile modulus of the second hardened layer; the tensile modulus of the polymer thin film layer ranges from 6 GPa to 9 GPa, the tensile modulus of the second hardened layer ranges from 10 GPa to 15 GPa, and the tensile modulus of the first hardened layer ranges from 9 GPa to 12 GPa.

5. The cover plate of claim 1, wherein the polymer thin film layer is any single film selected from a polyimide thin film, a polymethyl methacrylate thin film, and a polyethylene naphthalate thin film, or a composite film formed by stacking at least two films selected from a polyimide thin film, a polymethyl methacrylate thin film, and a polyethylene naphthalate thin film.

6. The cover plate of claim 5, wherein a thickness of the second hardened layer ranges from 5 μm to 25 μm, a thickness of the first hardened layer ranges from 5 μm to 25 μm, and a thickness of the polymer thin film layer ranges from 40 μm to 100 μm.

7. The cover plate of claim 4, wherein the polymer thin film layer is any single film selected from a polyimide thin film, a polymethyl methacrylate thin film, and a polyethylene naphthalate thin film, or a composite film formed by stacking at least two films selected from a polyimide thin film, a polymethyl methacrylate thin film, and a polyethylene naphthalate thin film.

8. The cover plate of claim 1, wherein a thickness of the second hardened layer ranges from 5 μm to 25 μm, a thickness of the first hardened layer ranges from 5 μm to 25 μm, and a thickness of the polymer thin film layer ranges from 40 μm to 100 μm.

9. The cover plate of claim 7, wherein a thickness of the second hardened layer ranges from 5 μm to 25 μm, a thickness of the first hardened layer ranges from 5 µm to 25 µm, and a thickness of the polymer thin film layer ranges from 40 µm to 100 µm.

10. The cover plate of claim 1, wherein a side of the first hardened layer or the second hardened layer distal to the polymer thin film layer is provided with an adhesive layer thereon.

11. The cover plate of claim 10, wherein a pencil hardness of the second hardened layer is greater than or equal to 9H; a pencil hardness of the first hardened layer ranges from 6H to 8H; a tensile modulus of the polymer thin film layer is greater than a tensile modulus of the first hardened layer, and is less than a tensile modulus of the second hardened layer, the tensile modulus of the polymer thin film layer ranges from 6 GPa to 9 GPa, the tensile modulus of the second hardened layer ranges from 10 GPa to 15 GPa, and the tensile modulus of the first hardened layer ranges from 9 GPa to 12 GPa; and the polymer thin film layer is any single film selected from a polyimide thin film, a polymethyl methacrylate thin film, and a polyethylene naphthalate thin film, or a composite film formed by stacking at least two films selected from a polyimide thin film, a polymethyl methacrylate thin film, and a polyethylene naphthalate thin film; a thickness of the second hardened layer ranges from 5 µm to 25 µm, a thickness of the first hardened layer ranges from 5 µm to 25 µm, and a thickness of the polymer thin film layer ranges from 40 µm to 100 µm.

12. The cover plate of claim 1, wherein the cover plate has a bending region by which the cover plate is formed as a curved surface, and the second hardened layer in the bending region has a patterned pattern to form, in the second hardened layer, a plurality of spaces in which no second hardened layer is coated therein.

13. The cover plate of claim 12, wherein a pencil hardness of the second hardened layer is greater than or equal to 9H; and a pencil hardness of the first hardened layer ranges from 6H to 8H.

14. The cover plate of claim 12, wherein a tensile modulus of the polymer thin film layer is greater than a tensile modulus of the first hardened layer, and is less than a tensile modulus of the second hardened layer; the tensile modulus of the polymer thin film layer ranges from 6 GPa to 9 GPa, the tensile modulus of the second hardened layer ranges from 10 GPa to 15 GPa, and the tensile modulus of the first hardened layer ranges from 9 GPa to 12 GPa.

15. The cover plate of claim 12, wherein the polymer thin film layer is any single film selected from a polyimide thin film, a polymethyl methacrylate thin film, and a polyethylene naphthalate thin film, or a composite film formed by stacking at least two films selected from a polyimide thin film, a polymethyl methacrylate thin film, and a polyethylene naphthalate thin film.

16. The cover plate of claim 12, wherein a thickness of the second hardened layer ranges from 5 µm to 25 µm, a thickness of the first hardened layer ranges from 5 µm to 25 µm, and a thickness of the polymer thin film layer ranges from 40 µm to 100 µm.

17. A flexible display device comprising a flexible substrate and a cover plate provided on a side of the flexible substrate, the cover plate being the cover plate of claim 1.

18. The flexible display device of claim 17, wherein the flexible substrate is a curved flexible substrate, the cover plate is provided on a side of the flexible substrate having a smaller bending curvature, and the second hardened layer is disposed closer to the flexible substrate than the first hardened layer.

19. The flexible display device of claim 17, wherein the flexible substrate is a curved flexible substrate, the cover plate is provided on a side of the flexible substrate having a larger bending curvature, and the first hardened layer is disposed closer to the flexible substrate than the second hardened layer.

* * * * *